United States Patent
Huang et al.

(10) Patent No.: US 9,548,404 B2
(45) Date of Patent: Jan. 17, 2017

(54) METHOD FOR FABRICATING ANTI-REFLECTION FILM WITH ANTI-PID EFFECT

(71) Applicant: DONGFANG ELECTRIC (YIXING) MAGI SOLAR POWER TECHNOLOGY CO., LTD., Jiangsu (CN)

(72) Inventors: Lun Huang, Jiangsu (CN); Chunhui Lu, Jiangsu (CN); Junqing Wu, Jiangsu (CN); Zerong Hou, Jiangsu (CN); Jinwei Wang, Jiangsu (CN)

(73) Assignee: DONGFANG ELECTRIC (YIXING) MAGI SOLAR POWER TECHNOLOGY CO., LTD, Jiangsu (CN)

( * ) Notice: Subject to any disclaimer, the term of this patent is extended or adjusted under 35 U.S.C. 154(b) by 30 days.

(21) Appl. No.: 14/425,255

(22) PCT Filed: Jun. 20, 2013

(86) PCT No.: PCT/CN2013/077564
§ 371 (c)(1),
(2) Date: Mar. 2, 2015

(87) PCT Pub. No.: WO2014/032457
PCT Pub. Date: Mar. 6, 2014

(65) Prior Publication Data
US 2015/0221787 A1    Aug. 6, 2015

(30) Foreign Application Priority Data
Sep. 3, 2012  (CN) .......................... 2012 1 0321237

(51) Int. Cl.
*H01L 21/00* (2006.01)
*H01L 31/0216* (2014.01)
(Continued)

(52) U.S. Cl.
CPC ..... *H01L 31/02168* (2013.01); *C23C 16/0218* (2013.01); *C23C 16/308* (2013.01);
(Continued)

(58) Field of Classification Search
CPC ...................... H01L 31/02168; C23C 16/0218
(Continued)

(56) References Cited

U.S. PATENT DOCUMENTS 6,010,756 A    1/2000  Gasworth

FOREIGN PATENT DOCUMENTS

CN    202004002 U    10/2011
CN    102610663 A    7/2012
(Continued)

OTHER PUBLICATIONS

CN102361037.*
(Continued)

*Primary Examiner* — Sonya D McCall Shepard
(74) *Attorney, Agent, or Firm* — Muncy, Geissler, Olds & Lowe, P.C.

(57) ABSTRACT

Provided is a method for fabricating anti-reflection film with anti-PID effect. The method comprises: vacuuming a furnace tube, holding the temperature in the furnace at 420° C. and the pressure as 80 mTorr for 4 minutes; pretreating silicon wafers at 420° C. with a nitrous oxide flux of 3.8-4.4 slm and pressure of 1700 mTorr for 3 minutes; testing pressure to keep a inner pressure of the furnace tube as a constant value of 50 mTorr for 0.2-0.5 minute; pre-depositing at 420° C., with a ammonia gas flux of 0.1-0.5 slm, a silane flux of 180 sccm-200 sccm, a nitrous oxide flux of 3.5-4.1 slm, pressure of 1000 mTorr and radio frequency power of 4300 w for 0.3-0.5 minute; depositing a film at 450° C., with a ammonia gas flux of 2000-2200 sccm, a silane flux of 7000-7500 sccm, a nitrous oxide flux of 2-2.4

(Continued)

slm, pressure of 1700 mTorr and radio frequency power of 4300 w for 3 minutes; blowing and cooling the film at 420° C. with a nitrogen gas flux of 6-10 slm, pressure of 10000 mTorr for 5-8 minutes. The deposition steps may be more than 2 steps. The obtained anti-reflection film has anti-PID effect, thus can improve the electrical performance of solar cells.

13 Claims, 1 Drawing Sheet

(51) Int. Cl.
| | |
|---|---|
| C23C 16/02 | (2006.01) |
| C23C 16/30 | (2006.01) |
| H01L 31/18 | (2006.01) |
| C23C 16/455 | (2006.01) |
| G02B 1/113 | (2015.01) |
| G02B 1/115 | (2015.01) |

(52) U.S. Cl.
CPC ........ *C23C 16/45523* (2013.01); *G02B 1/113* (2013.01); *G02B 1/115* (2013.01); *H01L 31/1804* (2013.01)

(58) Field of Classification Search
USPC .............................................. 438/72; 427/226
See application file for complete search history.

(56) References Cited

FOREIGN PATENT DOCUMENTS

| | | |
|---|---|---|
| CN | 102864439 A | 1/2013 |
| JP | 2006332510 A | 12/2006 |

OTHER PUBLICATIONS

JP 2012-057237.*
Master Degree Thesis by Feridun Ay, submitted in Sep. 2000 to Bilkent Universtiy "Silicon Oxynitride Layers for Applications in Optical Waveguides".*

* cited by examiner

METHOD FOR FABRICATING ANTI-REFLECTION FILM WITH ANTI-PID EFFECT

TECHNICAL FIELD

The present invention relates to the technical fields of production and processing of solar cells, and in more particular to a method for fabricating an anti-reflection film with anti-PID effect.

BACKGROUND ART

Being a photovoltaic element for energy conversion, a solar cell is able to convert light energy into electric energy under the irradiation of sunlight, with the aim of achieving power generation. An anti-reflection film is deposited on the surface of a solar cell to reduce light reflection on the surface of the cell and thus effectively improve the conversion efficiency of the cell. Meanwhile, the anti-reflection film can play a role of surface passivation and for the solar cell as well. Therefore, these two aspects should be taken into consideration comprehensively during the selection of the anti-reflection film material. The optical anti-reflection film material suitable for crystalline silicon solar cells includes silicon dioxide, silicon nitride or other thin film materials.

At present, anti-reflection films are grown mainly using PECVD the technical principle of which is as follows: with a low-temperature plasma serving as an energy source, a sample is heated up to a predetermined temperature by glow discharge or additional heating elements, and then a proper amount of reactive gases is fed in, followed by the fact that a solid-state thin film is formed on the surface of the sample after the reactive gases are subjected to a series of chemical reactions and plasma reactions. At present during the production of solar cells, ammonia and silane are generally used as the reactive gases, which form, upon the completion of reaction, a dark blue thin film in which silicon nitride plays a role of anti-reflection while hydrogen may exist for the purpose of body passivation. PECVD coating proposes high requirements on both temperature and vacuum degree. There are complicated gas paths due to the participation of several different gases in the reaction. Moreover, since the reactive gases are usually toxic, flammable and explosive, there exist potential safety hazards.

Researches have shown that a high voltage between a circuit existing in a crystalline PV module and a grounded metal frame thereof will result in continuous degradation of the photovoltaic performance of the module. There are a variety of mechanisms resulting in such degradation, for example, the phenomenon of ion migration in the packaging material for the cell of the module and in the material of the upper surface layer and lower surface layer of the module due to the effect of the above high voltage; the occurrence of hot carriers in the cell; reduction of the active layer of the cell owing to the charge redistribution; corrosion of related circuits, etc. These mechanisms resulting in such degradation are referred to as Potential Induced Degradation (PID), polarization, electrolytic corrosion and electrochemical corrosion. The majority of the above phenomena are most likely to occur under humid conditions, and their degrees of activity are related to the degree of humidity. Meanwhile, what is also related to the degradation phenomena mentioned above is the degree of contamination that conductive substances, acidic substances, alkaline substances and substances with ions cause to the surface of the module. In a practical application scenario, the PID phenomenon of the crystalline solar cell module has already been observed. Depending on the cell structure, different materials of other components and designs, the PID phenomenon may arise in a case when its circuit and the grounded metal frame create a positive voltage offset or in a case when its circuit and the grounded metal frame create a negative voltage offset. Related papers have stated that leak current, through a path formed by the packaging material (typically EVA and the upper surface of glass) and the module frame, is regarded as the main cause for the PID phenomenon. So far, it is actually not very clear how the leak current is formed. In general, an insulation system, which is formed after a cell is packaged, using the packaging material, is imperfect for the above leak current, and meanwhile, it is supposed that metal ions derived from soda-lime glass are the main current carrying medium of the abovementioned leak current having the PID effect. In addition, related papers have shown that, under actual application conditions, a certain period of time after the sun rises in the morning tends to be a time period during which the PID effect becomes relatively strong, the reason for which is that dew condensation (particularly dews in summer and autumn) may occur on the surface of the crystalline PV module without power generation through the whole night, and as a result of that the photovoltaic system, with its surface relatively humid, will encounter the abovementioned system voltage offset within the certain period of time after the sun rises in the morning.

At present, the solutions for solving PID focus mainly on three levels, i.e., solar cells, modules and solar systems or solar parks. The resistivity of solar cells, diffusion sheet resistance, anti-reaction film and other process qualities all have influences on the anti-PID performance of solar cells. For PV module industries, EVA, tempered glass, aluminum frames and other auxiliary materials also function as a bridge for the occurrence of potential induced degradation, so the improvement of such auxiliary materials is an effective way to solve potential induced degradation. As to solar systems and solar parks, potential induced degradation may be avoidable to some extent by improving inverters and grounding modes as well as by other such approaches.

With a life span up to 25 years, PV modules face a high likelihood of severe climate conditions. Serious PID may greatly decrease the power output of a power plant (degradation of over 90%), causing a grave damage to the interest of operators and power plant investors.

SUMMARY OF THE PRESENT INVENTION

The technical problem to be solved by the present invention is that, to further reduce the cost, an anti-reflection film having anti-PID effect is formed by developing and designing the structure of the anti-reflection film and then fabricating the anti-reflection film, thus realizing the most economical, simplest and most effective process solution for solving the PID effect.

To solve the above technical problem, the present invention employs a first technical solution as below.

A method for fabricating an anti-reflection film having anti-PID effect is provided, the anti-reflection film has a multi-layer film structure which is formed on a silicon substrate and has refractivities in descending order, the method for manufacturing the multi-layer film structure having refractivities in descending order includes the following steps of:

(1) Vacuuming a furnace tube, holding the temperature in the furnace at 420° C. and the pressure at 80 mTorr for 4 minutes;

(2) Pretreating silicon wafers at 420° C. with a nitrous oxide flux of 3.8-5.2 slm and pressure of 1700 mTorr for 3 minutes;

(3) Testing pressure to keep an inner pressure of the furnace tube at a constant value of 50 mTorr for 0.2-0.5 minutes;

(4) Pre-depositing at 420° C. with an ammonia gas flux of 0.1-0.9 slm, a silane flux of 180-200 sccm, a nitrous oxide flux of 3.5-5.1 slm, pressure of 1000 mTorr and radio frequency power of 4300 w for 0.3-0.5 minutes;

(5) Depositing at 450° C., with an ammonia gas flux of 2000-2200 sccm, a silane flux of 7000-8500 sccm, a nitrous oxide flux of 2-3.4 slm, inner pressure of the furnace tube of 1700 mTorr and radio frequency power of 4300 w operating on graphite boat plates in the furnace tube for 3-5 minutes, in which case, glow discharge is caused in the furnace tube in such an electric field, the fed-in process gases form a plasma after being collided with electrons, and the plasma having a quite high chemical activity forms a dielectric film layer onto the substrate; and (6) Blowing and cooling at 420° C. with a nitrogen gas flux of 6-12 slm and pressure of 10000 mTorr for 5-8 minutes.

Also provided in the present invention is a method including multiple depositions, which is specifically as follows:

a method for fabricating an anti-reflection film having anti-PID effect is provided, the anti-reflection film having a multi-layer film structure which is formed on a silicon substrate and has refractive indexes in descending order, characterized in that the method for manufacturing the multi-layer film structure having refractive indexes in descending order includes the following steps of:

(1) Vacuuming a furnace tube, holding the temperature in the furnace at 420° C. and the pressure at 80 mTorr for 4 minutes;

(2) Pretreating silicon wafers in the furnace tube at 420° C. with a nitrous oxide flux of 3.8-4.4 slm and pressure of 1700 mTorr for 3 minutes;

(3) Testing pressure to keep an inner pressure of the furnace tube at a constant value of 50 mTorr for 0.2-0.5 minutes;

(4) Pre-depositing at an inner temperature of the furnace tube of 420° C., with an ammonia gas flux of 0.1-0.5 slm, a silane flux of 180-200 sccm, a nitrous oxide flux of 3.5-4.1 slm, pressure of 1000 mTorr and radio frequency power of 4300 w operating on graphite boat plates in the furnace tube for 0.3-0.5 minutes;

(5) Depositing more than twice to form a multi-layer dielectric film on the silicon wafers; and (6) Blowing and cooling at 420° C. with a nitrogen gas flux of 6-10 slm and pressure of 10000 mTorr for 5-8 minutes;

wherein step (5) specifically includes: (51) depositing for the first time at an inner temperature of the furnace tube of 450° C., with an ammonia gas flux of 2000-2200 sccm, a silane flux of 7000-7500 sccm, a nitrous oxide flux of 2-2.4 slm, pressure of 1700 mTorr and radio frequency power of 4300 w operating on graphite boat plates in the furnace tube for 13 minutes, in which case, glow discharge is caused in the furnace tube in such an electric field, the fed-in process gases form a plasma after being collided with electrons, and the plasma having a quite high chemical activity forms a dielectric film layer onto the silicon slice; (52) depositing for the second time at an inner temperature of the furnace tube of 450° C., with an ammonia gas flux of 2200-2500 sccm, a silane flux of 7000-7400 sccm, a nitrous oxide flux of 2-2.4 slm, pressure of 1700 mTorr and radio frequency power of 4300 w for 5 minutes, in which case, glow discharge is caused in the furnace tube in such an electric field, the fed-in process gases form a plasma after being collided with electrons, and the plasma having a quite high chemical activity forms another dielectric film layer onto the silicon wafers; and, (53) depositing for the third time at an inner temperature of the furnace tube of 450° C., with an ammonia gas flux of 2500-2700 sccm, a silane flux of 7000-7400 sccm, a nitrous oxide flux of 2-2.4 slm, pressure of 1700 mTorr and radio frequency power of 4300 w for 2 minutes, in which case, glow discharge is caused in the furnace tube in such an electric field, the fed-in process gases form a plasma after being collided with electrons, and the plasma having a quite high chemical activity forms a dielectric film layer onto the substrate.

Further, in step (51), the ammonia gas flux is 2100 sccm, the silane flux is 7500 sccm and the nitrous oxide flux is 2.4 slm. In step (52), the ammonia gas flux is 2300 sccm, the silane flux is 7400 sccm and the nitrous oxide flux is 2.4 slm. In step (53), the ammonia gas flux is 2600 sccm, the silane flux is 7300 sccm and the nitrous oxide flux is 2.4 slm.

In step (2), the nitrous oxide flux is 4.4 slm. In step (4), the ammonia gas flux is 0.5 slm, the silane flux is 200 sccm and the nitrous oxide flux is 4.1 slm. In step (6), the nitrogen gas flux is 10 slim and the blowing time is 5 minutes.

According to the present invention, the depositions of the three layer anti-reflection film are performed using a tubular PECVD system which, with a discharge frequency of 40 kHz, is superior to those apparatuses generally with a discharge frequency of 250 kHz and 400 kHz in such aspects as electrical control and deposition stability. To reduce the damage of 40 kHz to the surface of a-wafers, a pulsed intermittent low-frequency field is employed to weaken surface bombardment.

According to the present invention, an anti-reflection film having a three-layer silicon oxynitride structure can be realized on the surface of a crystalline silicon substrate. The three-layer anti-reflection film has refractive indexes in descending order within an overall range from 1.9 to 2.4. In addition, those problems of limitations that exist in the previous fabrication methods of anti-reflection film merely from silicon oxynitride are solved in an innovative way, while at the same time diversifying the materials for the anti-reflection film.

Figure 1:
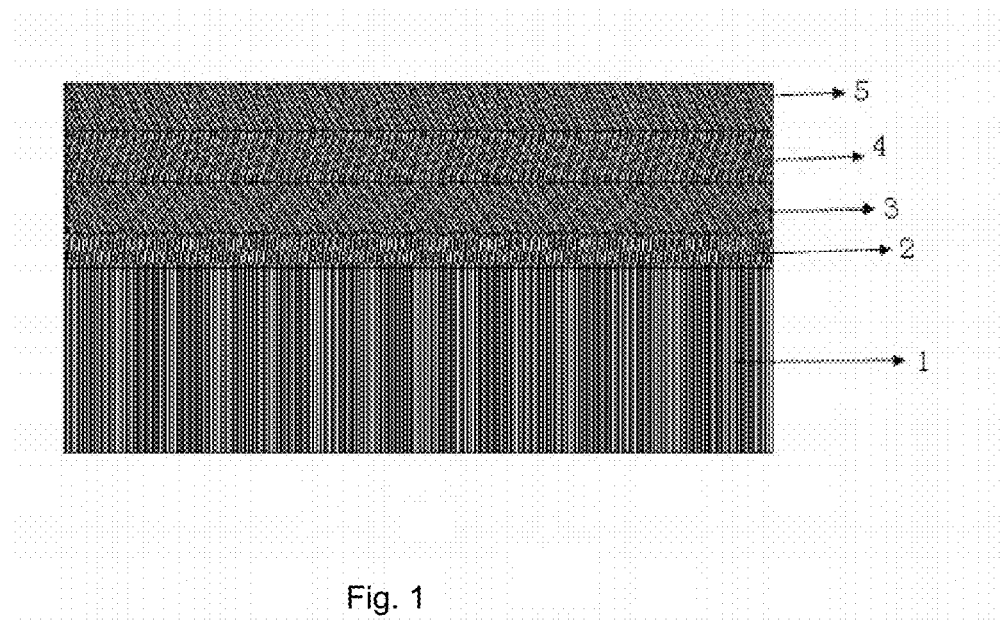
FIG. 1 is a cross-sectional structure diagram of a silicon wafer of an anti-reflection film having anti-PID effect obtained according to the fabrication method of the present invention.

Reference numbers in the accompanying drawings are described as below:

Reference number 1 represents a p-type silicon substrate;
Reference number 2 represents an N-type diffused emitter region;
Reference number 3 represents a first layer silicon oxynitride anti-reflection film;
Reference number 4 represents a second silicon layer oxynitride anti-reflection film;

Reference number 5 represents a third layer silicon oxynitride anti-reflection film.

DETAILED DESCRIPTION OF THE PRESENT INVENTION

The present invention will be further described in details below with reference to specific examples.

Example 1

Provided in the present invention is a method for fabricating an anti-reflection film with anti-PID effect, including the following steps of:

(1) Vacuuming a furnace tube, holding the temperature in the furnace at 420° C. and the pressure as 80 mTorr for 4 minutes;

(2) Pretreating silicon wafers at 420° C. with a nitrous oxide flux of 4.4 slm and pressure of 1700 mTorr for 3 minutes;

(3) Testing pressure to keep an inner pressure of the tube furnace tube at a constant value of 50 mTorr for 0.2-0.5 minutes;

(4) Pre-depositing at 420° C., with an ammonia gas flux of 0.5 slm, a silane flux of 200 sccm, a nitrous oxide flux of 4.1 slm, pressure of 1000 mTorr and radio frequency power of 4300 w for 0.3-0.5 minutes;

(5) Depositing at 450° C., with an ammonia gas flux of 2100 sccm, a silane flux of 7700 sccm, a nitrous oxide flux of 2.58 slm, inner pressure of the furnace tube of 1700 mTorr and radio frequency power of 4300 w operating on graphite boat plates in the furnace tube for 4 minutes, in which case, glow discharge is caused in the furnace tube in such an electric field, the fed-in process gases form a plasma after being collided with electrons, and the plasma having a quite high chemical activity forms a dielectric film layer onto the substrate; and (6) Blowing and cooling at 420° C. with a nitrogen gas flux of 10 slm and pressure of 10000 mTorr for 5-8 minutes.

Example 2

Provided in the present invention is a method for fabricating an anti-reflection film with anti-PID effect, including the following steps of:

(1) Vacuuming a furnace tube, holding the temperature in the furnace at 420° C. and the pressure as 80 mTorr for 4 minutes;

(2) Pretreating silicon wafers at 420° C. with a nitrous oxide flux of 3.8 slm and pressure of 1700 mTorr for 3 minutes;

(3) Testing pressure to keep an inner pressure of the furnace tube at a constant value of 50 mTorr for 0.2-0.5 minutes;

(4) Pre-depositing at 420° C., with an ammonia gas flux of 0.1 slm, a silane flux of 180 sccm, a nitrous oxide flux of 3.5 slm, pressure of 1000 mTorr and radio frequency power of 4300 w for 0.3-0.5 minutes;

(5) Depositing at 450° C., with an ammonia gas flux of 2160 sccm, a silane flux of 8000 sccm, a nitrous oxide flux of 2.8 slm, inner pressure of the furnace tube of 1700 mTorr and radio frequency power of 4300 w operating on graphite boat plates in the furnace tube for 3.5 minutes, in which case, glow discharge is caused in the furnace tube in such an electric field, the fed-in process gases form a plasma after being collided with electrons, and the plasma having a quite high chemical activity forms a dielectric film layer onto the substrate; and (6) Blowing and cooling at 420° C. with a nitrogen gas flux of 8 slm and pressure of 10000 mTorr for 5-8 minutes.

Example 3

Provided in the present invention is a method for fabricating an anti-reflection film with anti-PID effect, including the following steps of:

(1) Vacuuming a furnace tube, holding the temperature in the furnace at 420° C. and the pressure as 80 mTorr for 4 minutes;

(2) Pretreating silicon wafers at 420° C. with a nitrous oxide flux of 4.8 slm and pressure of 1700 mTorr for 3 minutes;

(3) Testing pressure to keep an inner pressure of the furnace tube at a constant value of 50 mTorr for 0.2-0.5 minutes;

(4) Pre-depositing at 420° C., with an ammonia gas flux of 0.7 slm, a silane flux of 200 sccm, a nitrous oxide flux of 4.2 slm, pressure of 1000 mTorr and radio frequency power of 4300 w for 0.3-0.5 minutes;

(5) Depositing at 450° C., with an ammonia gas flux of 2190 sccm, a silane flux of 8500 sccm, a nitrous oxide flux of 3.4 slm, inner pressure of the furnace tube as low as 1700 mTorr and radio frequency power of 4300 w operating on graphite boat plates in the furnace tube for 4.5 minutes, in which case, glow discharge is caused in the furnace tube in such an electric field, the fed-in process gases form plasma after being collided by electrons, and the plasma having a quite high chemical activity forms a dielectric film layer onto the substrate; and (6) Blowing and cooling at 420° C. with a nitrogen gas flux of 6 slm and pressure of 10000 mTorr for 5-8 minutes.

Example 4

The present invention provides a method for fabricating an anti-reflection film with anti-PID effect, including the following steps of:

(1) Vacuuming a furnace tube, holding the temperature in the furnace at 420° C. and the pressure as 80 mTorr for 4 minutes;

(2) Pretreating silicon wafers at 420° C. with a nitrous oxide flux of 5.2 slm and pressure of 1700 mTorr for 3 minutes;

(3) Testing pressure to keep an inner pressure of the furnace tube at a constant value of 50 mTorr for 0.2-0.5 minutes;

(4) Pre-depositing at 420° C., with an ammonia gas flux of 0.9 slm, a silane flux of 190 sccm, a nitrous oxide flux of 5.1 slm, pressure of 1000 mTorr and radio frequency power of 4300 w for 0.4 minutes;

(5) Depositing at 450° C., with an ammonia gas flux of 2000 sccm, a silane flux of 8300 sccm, a nitrous oxide flux of 3.0 slm, inner pressure of the furnace tube as low as 1700 mTorr and radio frequency power of 4300 w operating on graphite boat plates in the furnace tube for 5 minutes, in which case, glow discharge is caused in the furnace tube in such an electric field, the fed-in process gases form plasma after being collided by electrons, and the plasma having a quite high chemical activity forms a dielectric film layer onto the substrate; and (6) Blowing and cooling at 420° C. with a nitrogen gas flux of 12 slm and pressure of 10000 mTorr for 5-8 minutes.

Example 5

The present invention provides a method for fabricating an anti-reflection film with anti-PID effect, including the following steps of:

(1) Vacuuming a furnace tube, holding the temperature in the furnace at 420° C. and the pressure at 80 mTorr for 4 minutes;

(2) Pretreating silicon wafers at 420° C. with a nitrous oxide flux of 4.4 slm and pressure of 1700 mTorr for 3 minutes;

(3) Testing pressure to keep an inner pressure of the furnace tube as a constant value of 50 mTorr for 0.2-0.5 minutes;

(4) Pre-depositing at 420° C., with an ammonia gas flux of 0.5 slm, a silane flux of 200 sccm, a nitrous oxide flux of 4.1 slm, pressure of 1000 mTorr and radio frequency power of 4300 w for 0.3-0.5 minutes;

(5) Performing the first time of deposition at an inner temperature of the furnace tube of 450° C., with an ammonia gas flux of 2110 sccm, a silane flux of 7335 sccm, a nitrous oxide flux of 2.05 slm, inner pressure of the furnace tube as low as 1700 mTorr and radio frequency power of 4300 w operating on graphite boat plates in the furnace tube for 13 minutes, in which case, glow discharge is caused in the furnace tube in such an electric field, the fed-in process gases form a plasma after being collided with electrons, and the plasma having a quite high chemical activity forms a dielectric film layer (reference number 3 in FIG. 1) onto the substrate;

(6) Depositing for the second time at 450° C., with an ammonia gas flux of 2430 sccm, a silicane flux of 7260 sccm, a nitrous oxide flux of 2.22 slm, inner pressure of the furnace tube as low as 1700 mTorr and radio frequency power of 4300 w operating on graphite boat plates in the furnace tube for 5 minutes, in which case, glow discharge is caused in the furnace tube in such an electric field, the fed-in process gases form a plasma after being collided with electrons, and the plasma having a quite high chemical activity forms a dielectric film layer (reference number 4 in FIG. 1) onto the substrate;

(7) Depositing for the third time at 450° C., with an ammonia gas flux of 2610 sccm, a silicane flux of 7210 sccm, a nitrous oxide flux of 2.18 slm, inner pressure of the furnace tube as low as 1700 mTorr and radio frequency power of 4300 w operating on graphite boat plates in the furnace tube for 2 minutes, in which case, glow discharge is caused in the furnace tube in such an electric field, the fed-in process gases form a plasma after being collided with electrons, and the plasma having a quite high chemical activity forms a dielectric film layer (reference number 5 in FIG. 1) onto the substrate; and (8) Blowing and cooling at 420° C. with a nitrogen gas flux of 10 slm and pressure of 10000 mTorr for 5-8 minutes.

Example 6

(1) Vacuuming a furnace tube, holding the temperature in the furnace at 420° C. and the pressure at 80 mTorr for 4 minutes;

(2) Pretreating silicon wafers at 420° C. with a nitrous oxide flux of 3.8 slm and pressure of 1700 mTorr for 3 minutes;

(3) Testing pressure to keep an inner pressure of the furnace tube at a constant value of 50 mTorr for 0.2-0.5 minutes;

(4) Pre-depositing at 420° C., with an ammonia gas flux of 0.1 slm, a silane flux of 180 sccm, a nitrous oxide flux of 3.5 slm, pressure of 1000 mTorr and radio frequency power of 4300 w for 0.3-0.5 minutes;

(5) Depositing for the first time at 450° C., with an ammonia gas flux of 2320 sccm, a silane flux of 7380 sccm, a nitrous oxide flux of 2.35 slm, inner pressure of the furnace tube as low as 1700 mTorr and radio frequency power of 4300 w operating on graphite boat plates in the furnace tube for 13 minutes, in which case, glow discharge is caused in the furnace tube in such an electric field, the fed-in process gases form a plasma after being collided with electrons, and the plasma having a quite high chemical activity forms a dielectric film layer onto the substrate;

(6) Depositing for the second time at 450° C., with an ammonia gas flux of 2330 sccm, a silane flux of 7350 sccm, a nitrous oxide flux of 2.32 slm, inner pressure the furnace tube as low as 1700 mTorr and radio frequency power of 4300 w operating on graphite boat plates in the furnace tube for 5 minutes, in which case, glow discharge is caused in the furnace tube in such an electric field, the fed-in process gases form a plasma after being collided with electrons, and the plasma having a quite high chemical activity forms a dielectric film layer onto the substrate;

(7) Depositing for the third time at 450° C., with an ammonia gas flux of 2530 sccm, a silane flux of 7120 sccm, a nitrous oxide flux of 2.12 slm, inner pressure of the furnace tube as low as 1700 mTorr and radio frequency power of 4300 w operating on graphite boat plates in the furnace tube for 2 minutes, in which case, glow discharge is caused in the furnace tube in such an electric field, the fed-in process gases form a plasma after being collided with electrons, and the plasma having a quite high chemical activity forms a dielectric film layer onto the substrate; and (8) Blowing and cooling at 420° C. with a nitrogen gas flux of 6 slm and pressure of 10000 mTorr for 5-8 minutes.

Example 7

(1) Vacuuming a furnace tube, holding the temperature in the furnace at 420° C. and the pressure as 80 mTorr for 4 minutes;

(2) Pretreating silicon wafers at 420° C. with a nitrous oxide flux of 3.8 slm and pressure of 1700 mTorr for 3 minutes;

(3) Testing pressure to keep an inner pressure of the furnace tube as a constant value of 50 mTorr for 0.2-0.5 minutes;

(4) Pre-depositing at 420° C., with an ammonia gas flux of 0.1 slm, a silane flux of 180 sccm, a nitrous oxide flux of 3.5 slm, pressure of 1000 mTorr and radio frequency power of 4300 w for 0.35 minutes;

(5) Depositing for the first time at 450° C., with an ammonia gas flux of 2400 sccm, a silane flux of 7270 sccm, a nitrous oxide flux of 2.25 slm, inner pressure of the furnace tube as low as 1700 mTorr and radio frequency power of 4300 w operating on graphite boat plates in the furnace tube for 13 minutes, in which case, glow discharge is caused in the furnace tube in such an electric field, the fed-in process gases form a plasma after being collided with electrons, and the plasma having a quite high chemical activity forms a dielectric film layer onto the substrate;

(6) Depositing for the second time at 450° C., with an ammonia gas flux of 2330 sccm, a silane flux of 7350 sccm, a nitrous oxide flux of 2.32 slm, inner pressure of the furnace tube as low as 1700 mTorr and radio frequency power of 4300 w acting on graphite boat plates in the furnace tube for 5 minutes, in which case, glow discharge is caused in the furnace tube in such an electric field, the fed-in process gases form a plasma after being collided with electrons, and the plasma having a quite high chemical activity forms a dielectric film layer onto the substrate; and (7) Blowing and cooling at 420° C. with a nitrogen gas flux of 6 slm and pressure of 10000 mTorr for 5-8 minutes.

Figure 2:
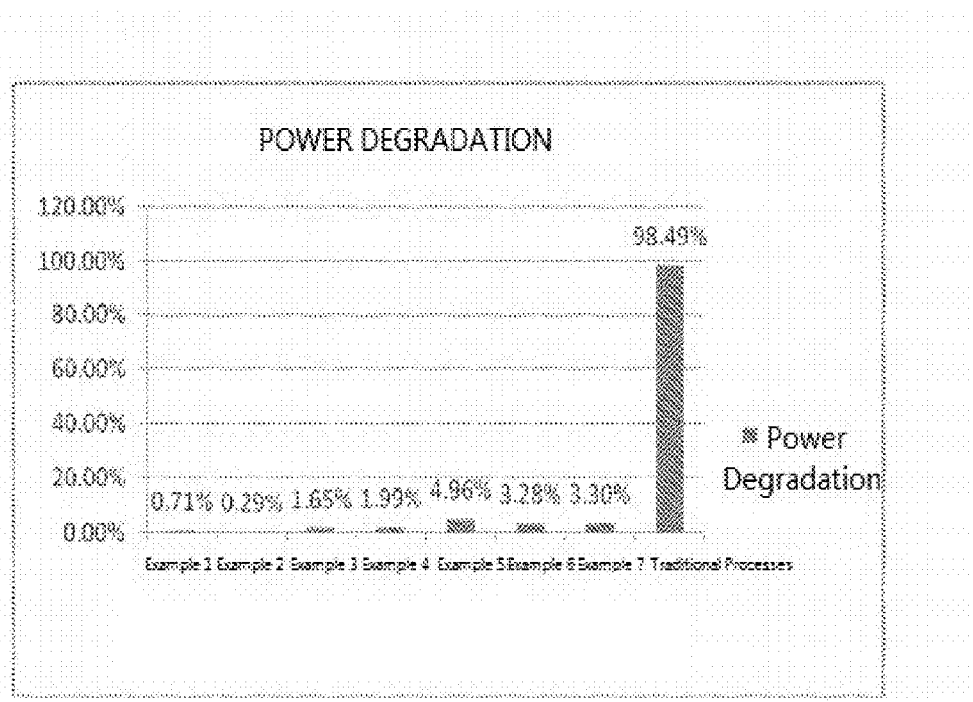
FIG. 2 is a comparison diagram of power degradation between seven examples according to the present invention and a module manufactured from solar cells through traditional processes under the abovementioned anti-PID measurement conditions.

Under IEC61215, no eligible ratio or detection standard with respect to potential-induced power degradation has yet been set for PV modules at present. The approach commonly adopted in the current photovoltaic industry is that under the condition of a temperature of 85° C. and a humidity of 85 RH %, a high reverse voltage of 1000V is applied to the module, and meanwhile, an aluminum foil or an additional material is spread over the front surface of the module. 96 hours later, the power degradation of the module is measured. It is currently believed that where the percentage of degradation is 5% or below, the module may be perceived as having an anti-PID function. Given below are the anti-PID results of seven examples using the present invention and a module manufactured from solar cells through traditional processes under the abovementioned anti-PID measurement conditions, as shown in FIG. 2.

The data indicates that the PID power lose of the modules using solar cells fabricated through the method of present invention can be (all below 5%).

The invention claimed is:

1. A method for fabricating an anti-reflection film with anti-PID effect, the anti-reflection film having a multi-layer film structure which is formed on a silicon wafer substrate and has refractive indexes in descending order, characterized in that the method for manufacturing the multi-layer film structure having refractive indexes in descending order comprises the following steps of:
   (1) vacuuming a furnace tube, holding the temperature in the furnace at 420° C. and the pressure as 80 mTorr for 4 minutes;
   (2) pretreating silicon wafers at 420° C. with a nitrous oxide flux of 3.8-5.2 slm and pressure of 1700 mTorr for 3 minutes;
   (3) testing pressure to keep an inner pressure of the furnace tube as a constant value of 50 mTorr for 0.2-0.5 minutes;
   (4) pre-depositing at 420° C. with an ammonia gas flux of 0.1-0.9 slm, a silane flux of 180-200 sccm, a nitrous oxide flux of 3.5-5.1 slm, pressure of 1000 mTorr and radio frequency power of 4300 w for 0.3-0.5 minutes;
   (5) depositing a film at 450° C., with an ammonia gas flux of 2000-2200 sccm, a silane flux of 7000-8500 sccm, a nitrous oxide flux of 2-3.4 slm, pressure of 1700 mTorr and radio frequency power of 4300 w for 3-5 minutes; and
   (6) blowing and cooling the film at 420° C. with a nitrogen gas flux of 6-12 slm and pressure of 10000 mTorr for 5-8 minutes.

2. The method for fabricating an anti-reflection film with anti-PID effect according to claim 1, characterized in that the nitrous oxide flux in step (2) is 4.4 slm.

3. The method for fabricating an anti-reflection film with anti-PID effect according to claim 1, characterized in that in step (4), the ammonia gas flux is 0.5 slm, the silane flux is 200 sccm and the nitrous oxide flux is 4.1 slm.

4. The method for fabricating an anti-reflection film with anti-PID effect according to claim 1, characterized in that in step (5), the ammonia gas flux is 2100 sccm, the silane flux is 7500 sccm and the nitrous oxide flux is 2.4 slm.

5. The method for fabricating an anti-reflection film with anti-PID effect according to claim 1, characterized in that in step (6), the nitrogen gas flux is 10 slm and the blowing time is 5 minutes.

6. A method for fabricating an anti-reflection film with anti-PID effect, the anti-reflection film having a multi-layer film structure which is formed on a silicon wafer substrate and has refractive indexes in descending order, characterized in that the method for manufacturing the multi-layer film structure having refractive indexes in descending order comprises the following steps of:
   (1) vacuuming a furnace tube, holding the temperature in the furnace at 420° C. and the pressure as 80 mTorr for 4 minutes;
   (2) pretreating silicon wafers at 420° C. with a nitrous oxide flux of 3.8-4.4 slm and pressure of 1700 mTorr for 3 minutes;
   (3) testing pressure to keep an inner pressure of the furnace tube as a constant value of 50 mTorr for 0.2-0.5 minutes;
   (4) pre-depositing at an inner temperature of the furnace tube of 420° C., with an ammonia gas flux of 0.1-0.5 slm, a silane flux of 180-200 sccm, a nitrous oxide flux of 3.5-4.1 slm, pressure of 1000 mTorr and radio frequency power of 4300 w operating on graphite boat plates in the furnace tube for 0.3-0.5 minutes;
   (5) depositing more than twice to form a multi layer dielectric films on the silicon wafer; and
   (6) blowing and cooling at 420° C. with a nitrogen gas flux of 6-10 slm and pressure of 10000 mTorr for 5-8 minutes.

7. The method for fabricating an antireflection film with anti-PID effect according to claim 6, characterized in that step (5) specifically comprises:
   (51) depositing for the first time at an inner temperature of the furnace tube of 450° C., with an ammonia gas flux of 2000-2200 sccm, a silane flux of 7000-7500 sccm, a nitrous oxide flux of 2-2.4 slm, pressure of 1700 mTorr and radio frequency power of 4300 w operating on graphite boat plates in the furnace tube for 13 minutes, in which case, glow discharge is caused in the furnace tube in such an electric field, the fed-in process gases form a plasma after being collided with electrons, and the plasma having a quite high chemical activity forms a dielectric film layer onto the silicon wafer;
   (52) depositing for the second time at an inner temperature of the furnace tube of 450° C., with an ammonia gas flux of 2200-2500 sccm, a silane flux of 7000-7400 sccm, a nitrous oxide flux of 2-2.4 slm, pressure of 1700 mTorr and radio frequency power of 4300 w for 5 minutes, in which case, glow discharge is caused in the furnace tube in such an electric field, the fed-in process gases form a plasma after being collided with electrons, and the plasma having a quite high chemical activity forms another dielectric film layer onto the silicon wafer;
   (53) depositing for the third time at an inner temperature of the furnace tube of 450° C., with an ammonia gas flux of 2500-2700 sccm, a silicane flux of 7000-7400 sccm, a nitrous oxide flux of 2-2.4 slm, pressure of 1700 mTorr and radio frequency power of 4300 w for 2 minutes, in which case, glow discharge is caused in the furnace tube in such an electric field, the fed-in process gases form a plasma after being collided with electrons, and the plasma having a quite high chemical activity forms a dielectric film layer onto the substrate.

8. The method for fabricating an antireflection film with anti-PID effect according to claim 7, characterized in that in step (51), the ammonia gas flux is 2100 sccm, the silane flux is 7500 sccm and the nitrous oxide flux is 2.4 slm.

9. The method for fabricating an antireflection film with anti-PID effect according to claim 7, characterized in that in step (52), the ammonia gas flux is 2300 sccm, the silane flux is 7400 sccm and the nitrous oxide flux is 2.4 slm.

10. The method for fabricating an antireflection film with anti-PID effect according to claim 7, characterized in that in step (53), the ammonia gas flux is 2600 sccm, the silane flux is 7300 sccm and the nitrous oxide flux is 2.4 slm.

11. The method for fabricating an antireflection film having anti-PID effect according to claim 6, characterized in that the nitrous oxide flux in step (2) is 4.4 slm.

12. The method for fabricating an antireflection film with anti-PID effect according to claim 6, characterized in that in step (4), the ammonia gas flux is 0.5 slm, the silane flux is 200 sccm and the nitrous oxide flux is 4.1 slm.

13. The method for fabricating an antireflection film with anti-PID effect according to claim 6, characterized in that in step (6), the nitrogen gas flux is 10 slm and the blowing time is 5 minutes.

\* \* \* \* \*